(12) United States Patent
Wasserman et al.

(10) Patent No.: US 9,625,548 B2
(45) Date of Patent: Apr. 18, 2017

(54) SYSTEM AND METHOD FOR MAGNETIC RESONANCE IMAGING OF INTRACRANIAL VESSEL WALLS

(71) Applicant: Johns Hopkins University, Baltimore, MD (US)

(72) Inventors: Bruce A. Wasserman, Baltimore, MD (US); Ye Qiao, Baltimore, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 971 days.

(21) Appl. No.: 13/922,111

(22) Filed: Jun. 19, 2013

(65) Prior Publication Data

US 2013/0335083 A1 Dec. 19, 2013

Related U.S. Application Data

(60) Provisional application No. 61/661,520, filed on Jun. 19, 2012.

(51) Int. Cl.
*G01V 3/00* (2006.01)
*G01R 33/48* (2006.01)
(Continued)

(52) U.S. Cl.
CPC ..... *G01R 33/4806* (2013.01); *G01R 33/5635* (2013.01); *G01R 33/4826* (2013.01); *G01R 33/5607* (2013.01); *G01R 33/5617* (2013.01)

(58) Field of Classification Search
CPC .................................................. G01R 33/5607
(Continued)

(56) References Cited

U.S. PATENT DOCUMENTS 5,307,014 A * 4/1994 Laub .................... G01R 33/563
324/306
8,884,619 B2 * 11/2014 Umeda .............. G01R 33/3607
324/307

(Continued)

OTHER PUBLICATIONS

Alexander et al., Intracranial black-blood MR angiography with high-resolution 3D fast spin echo. Magn Reson Med 1998;40(2):298-310.

(Continued)

*Primary Examiner* — Louis Arana
(74) *Attorney, Agent, or Firm* — Venable LLP; Henry J. Daley

(57) ABSTRACT

A magnetic resonance imaging (MRI) system for intracranial vessel wall imaging. The MRI system includes a radio frequency (RF) coil system to irradiate radio frequency (RF) pulses into a region of interest and detect a plurality of RF response signals, and a signal processing unit adapted to analyze the plurality of RF response signals. The RF coil system arranges the RF pulses in a pulse sequence including an excitation pulse and refocusing pulses which induce corresponding flip angles. A minimum flip angle is in the range of 30 degrees to 65 degrees, and a maximum flip angle is in the range of 100 degrees to 150 degrees. The signal processing unit analyzes the RF response signals with a three-dimensional isotropic resolution of 500 cubic microns or less and orders the RF response signals in k-space to enhance contrast between intracranial vessel wall tissue and cerebrospinal fluid or blood.

18 Claims, 11 Drawing Sheets

(51) Int. Cl.
G01R 33/563 (2006.01)
G01R 33/56 (2006.01)
G01R 33/561 (2006.01)

(58) Field of Classification Search
USPC .......................................... 324/306, 307, 309
See application file for complete search history.

(56) References Cited

U.S. PATENT DOCUMENTS

| 9,151,816 | B2* | 10/2015 | Fautz | G01R 33/56545 |
| 2015/0071514 | A1* | 3/2015 | Wang | A61B 5/7221 |
| | | | | 382/131 |
| 2015/0190055 | A1* | 7/2015 | Park | A61B 5/055 |
| | | | | 600/410 |
| 2015/0355304 | A1* | 12/2015 | Kurokawa | A61B 5/055 |
| | | | | 324/309 |

OTHER PUBLICATIONS

Antiga et al., On the overestimation of early wall thickening at the carotid bulb by black blood MRI, with implications for coronary and vulnerable plaque imaging. Magn Reson Med 2008;60(5):1020-1028.
Ashley et al., Moyamoya phenomenon secondary to intracranial atherosclerotic disease: diagnosis by 3T magnetic resonance imaging. J Neuroimaging 2009;19(4):381-384.
Balu et al., Carotid plaque assessment using fast 3D isotropic resolution black-blood MRI, Magn Reson Med Apr. 2010.
Bland et al., Statistical methods for assessing agreement between two methods of clinical measurement. Lancet 1986;1(8476):307-310.
Busse et al., Effects of refocusing flip angle modulation and view ordering in 3D fast spin echo. Magn Reson Med 2008;60(3):640-649.
Busse et al., Fast spin echo sequences with very long echo trains: design of variable refocusing flip angle schedules and generation of clinical T2 contrast. Magn Reson Med 2006;55(5):1030-1037.
Caplan LR. Intracranial large artery occlusive disease. Curr Neurol Neurosci Rep 2008;8(3):177-181.
Cerrato et al.,. Atherosclertotic adult Moya-Moya disease in a patient with hyperhomocysteinaemia. Neurol Sci 2007;28(1):45-47.
Crowe et al., Volume-selective 3D turbo spin echo imaging for vascular wall imaging and distensibility measurement. J Magn Reson Imaging 2003;17(5):572-580.
Edelman et al., Fast selective black blood MR imaging. Radiology 1991;181(3):655-660. (Abstract only).
Fan et al., Carotid arterial wall MRI at 3T using 3D variable-flip-angle turbo spin-echo (TSE) with flow-sensitive dephasing (FSD). J Magn Reson Imaging 2010;31(3):645-654.
Greenman et al., An assessment of the sharpness of carotid artery tissue boundaries with acquisition voxel size and field strength. Magn Reson Imaging 2008;26(2):246-253.
Hennig et al., Multiecho sequences with variable refocusing flip angles: optimization of signal behavior using smooth transition between pseudo steady states (TRAPS). Magn Reson Med 2003;49(3):527-535.
Jara et al., Voxel sensitivity function description of flow-induced signal loss in MR imaging: Implications for black-blood MR angriography with turbo spin-echo sequences. Magn Reson Med 1999;41(3):575-590.
Klein et al., High-resolution MRI Identifies basilar artery plaques in paramedian pontine infarct. Neurology 2005;64(3):551-552.
Koktzoglou et al., Three-dimensional black-blood MR imaging of carotid arteries with segmented steady-state free precession: initial experience. Radiology 2007;243(1):220-228.
Li et al., Atherosclerosis of middle cerebral artery: evaluation with high-resolution MR imaging at 3T. Atherosclerosis 2009;204(2):447-452.
Lu et al., Routine clinical brain MRI sequences for use at 3.0 Tesla. J Magn Reson Imaging 2005;22(1):13-22.
Mazighi et al., Autopsy prevalence of intracranial atherosclerosis in patients with fatal stroke. Stroke 2008;39(4):1142-1147.
Qureshi et al., Consensus conference on intracranial atherosclerotic disease: rationale, methodology, and results. J Neuroimaging 2009;19 Suppl 1:1S-10S.
Rousson et al., Assessing intrarater, interrater and test-retest reliability of continuous measurements. Stat Med 2002;21(22):3431-3446.
Ryu et al., High resolution wall and lumen MRI of the middle cerebral arteries at 3 tesla. Cerebrovasc Dis 2009;27(5):433-442.
Saam et al., High-resolution black-blood contrast-enhanced T1 weighted images for the diagnosis and follow-up of intracranial arteritis. Br J Radiol 2010;83(993):e182-184.
Sacco et al., Race-ethnicity and determinants of intracranial atherosclerotic cerebral infraction. The Northern Manhattan Stroke Study. Stroke 1995;26(1):14-20.
Storey et al., Tailoring the flow sensitivity of fast spin-echo sequences for noncontrast peripheral MR angiography. Magn Reson Med Aug. 2010;64(4):1098-1108.
Swartz Intracranial arterial wall imaging using high-resolution 3-tesla contrast-enhanced MRI. Neurology 2009;72(7):627-634.
Thubrikar Pressure-induced arterial wall stress and atherosclerosis. Ann Thorac Surg 1995;59(6):1594-1603.
Toussaint T2-weighted contrast for NMR characterization of human atherosclerosis. Arteriosclerosis, thrombosis, and vascular biology 1995;15(10):1533-1542.
Wasserman MRI measurement of carotid plaque in the atherosclerosis risk in communities (ARIC) study: methods, reliability and descriptive statistics. J Magn Reson Imaging 2010;31(2):406-415.
Wasserman Carotid artery atherosclerosis: in vivo morphologic characterization with gadolinium-enhanced double-oblique MR imaging initial results. Radiology 2002;223(2):566-573.
Wasserman Low-grade carotid stenosis: looking beyond the lumen with MRI. Stroke 2005;36(11):2504-2513.
Wityk Race and sex differences in the distribution of cerebral atherosclerosis. Stroke 1996;27(11):1974-1980.
Xu In vivo high-resolution MR imaging of symptomatic and asymptomatic middle cerebral artery atherosclerotic stenosis. Atherosclerosis Jun. 2010;212(2):507-511.
Yuan Identification of fibrous cap rupture with magnetic resonance imaging is highly associated with recent transient ischemic attack or stroke. Circulation 2002;105(2):181-185.
Zhang Measurement of carotid wall volume and maximum area with contrast-enhanced 3D MR imaging: initial observations. Radiology 2003;228(1):200-205.
Zhang Three-dimensional T2-weighted MRI of the human femoral arterial vessel wall at 3.0 Tesla. Invest Radiol 2009;44(9):619-626.

* cited by examiner

Figure 11. Morphologic measurements for intracranial vessel segments from 3D VISTA and 2D TSE images

|  | 2D TSE (0.5x0.5x2 mm³) | | | 3D VISTA (0.5x0.5x2 mm³) | | |
| --- | --- | --- | --- | --- | --- | --- |
|  | MCA | BA | Petrous ICA | MCA | BA | Petrous ICA |
| Lumen area (mm²) | 7.61±2.39 | 7.33±2.41 | 18.88±0.37 | 7.96±2.73 | 7.70±2.42 | 18.17±0.38 |
| Wall area (mm²) | 6.46±1.42 | 7.15±1.88 | 16.09±0.07 | 6.39±1.59 | 7.15±1.88 | 16.60±0.06 |
| Mean wall thickness (mm) | 0.57±0.07 | 0.65±0.08 | 0.97±0.16 | 0.58±0.06 | 0.65±0.07 | 0.96±0.14 |
| Maximum wall thickness (mm) | 0.77±0.10 | 0.85±0.17 | 1.42±0.32 | 0.77±0.10 | 0.84±0.12 | 1.35±0.28 | p not significant for paired (2D TSE-3D VISTA) measurements.

Figure 12. MRI measurement reliability based on VISTA acquired at 0.5mm isotropic resolution

|  |  | Petrous ICA | Supraclinoid ICA | BA | MCA |
|---|---|---|---|---|---|
| Mean Wall Thickness (mm) | Inter-reader | 0.91 | 0.94 | 0.84 | 0.64 |
|  | Intra-reader | 0.98 | 0.92 | 0.90 | 0.57 |
| Lumen area ($mm^2$) | Inter-reader | 0.98 | 0.92 | 0.94 | 0.82 |
|  | Intra-reader | 0.98 | 0.93 | 0.97 | 0.94 |
| Wall area ($mm^2$) | Inter-reader | 0.98 | 0.92 | 0.94 | 0.82 |
|  | Intra-reader | 0.99 | 0.99 | 0.93 | 0.95 |

SYSTEM AND METHOD FOR MAGNETIC RESONANCE IMAGING OF INTRACRANIAL VESSEL WALLS

CROSS-REFERENCE OF RELATED APPLICATION

This application claims priority to U.S. Provisional Application No. 61/661,520 filed Jun. 19, 2012, the entire contents of which are hereby incorporated by reference.

BACKGROUND

1. Field of Invention

The currently claimed embodiments of the invention relate to magnetic resonance imaging systems, and more particularly to magnetic resonance imaging systems that provide images of intracranial vessel walls.

2. Discussion of Related Art

The presence of intracranial vascular disease is highly predictive of stroke(1). However, disease prevalence may be underestimated due to the lack of an appropriate diagnostic tool to depict the intracranial vessel wall(2). Black blood MR imaging (BBMRI) has emerged as an effective method to measure wall thickness and identify pathological features of extracranial vessels(3-5). Recently, its application has been extended to evaluate intracranial vessels, specifically to detect atherosclerosis(6-9) and vasculitis(7,10). Measuring intracranial vessel wall thickness remains a technical challenge given the small size of these vessels. Furthermore, the techniques introduced thus far have been standard 2D black blood sequences, which are prone to partial volume artifacts amplified by the inherent curving course of intracranial vessels(11). This adds to the challenge of covering the numerous intracranial sites that are prone to atherosclerosis formation (e.g., basilar artery (BA), middle cerebral artery (MCA) and petrous internal carotid artery (ICA)(12)by 2D imaging.

Three-dimensional acquisitions enable high isotropic resolution that can minimize the overestimation of wall thickness as a consequence of the tortuosity of these small vessels; however, 3D techniques suffer from long scan times and suboptimal flow suppression(13). For example, double inversion recovery techniques(14,15) typically employed in 2D acquisitions generally provide inadequate flow suppression in 3D acquisitions because of the relatively thick re-inversion pulse required. Furthermore, the long echo train length (ETL) used to suppress flow by dephasing effects in 2D turbo spin echo (TSE) techniques(16) are not possible at 3D without impractically long scan times. A recently proposed 3D technique, Volumetric ISotropic TSE Acquisition (VISTA, Philips), employs variable-flip-angle refocusing pulses to achieve a longer ETL for more effective flow suppression without compromising signal and at relatively short scan times(17). In fact, this technique has been shown to have higher signal-to-noise ratio (SNR) efficiency and stronger black-blood effects compared with conventional 3D TSE sequences(17-19).

A 3D variable flip-angle refocusing pulse sequence has been employed to image carotid(19) and peripheral(20) arterial walls. However, one cannot intuit the successful application of this technique to intracranial wall imaging since these vessels are structurally unique. For example, they are surrounded by cerebrospinal fluid (CSF) rather than soft tissue (e.g. fat). Therefore, there remains a need for improved MRI systems for imaging intracranial vessel walls.

SUMMARY

According to one embodiment, a magnetic resonance imaging (MRI) system for intracranial vessel wall imaging is disclosed. The MRI system can include a main magnet providing a substantially uniform main magnetic field $B_0$ for a subject under observation, a radio frequency (RF) coil system configured to irradiate a plurality of radio frequency (RF) pulses into a region of interest of the subject and to detect a plurality of RF response signals emitted from the region of interest, and a signal processing unit in communication with the RF coil system adapted to analyze the plurality of RF response signals. The RF coil system can arrange the plurality of RF pulses in a pulse sequence. The pulse sequence can include an excitation pulse and a plurality of refocusing pulses inducing a corresponding plurality of flip angles. A minimum flip angle of the plurality of flip angles can be in the range of 30 degrees to 65 degrees, and a maximum flip angle of the plurality of flip angles can be in the range of 100 degrees to 150 degrees. The signal processing unit can analyze the plurality of RF response signals with a three-dimensional isotropic resolution of 500 cubic microns or less, and can order the plurality of RF response signals in k-space in order to enhance contrast between intracranial vessel wall tissue and at least one of cerebrospinal fluid or blood.

According to another embodiment, a method for magnetic resonance imaging of intracranial vessel walls is disclosed. The method can include irradiating a plurality of RF pulses into a subject under observation, recording a plurality of RF response signals from the subject under observation, analyzing the plurality of RF response signals. The plurality of RF pulses are arranged in a pulse sequence. The pulse sequence can include an excitation pulse and a plurality of refocusing pulses inducing a corresponding plurality of flip angles. A minimum flip angle of said plurality of flip angles can be in the range of 30 degrees to 65 degrees, and a maximum flip angle of the plurality of flip angles can be in the range of 100 degrees to 150 degrees. Analyzing the RF response signals can include analyzing said plurality of RF response signals with a three-dimensional isotropic resolution of 500 cubic microns or less and ordering said RF response signals in k-space in order to enhance contrast between intracranial vessel wall tissue and at least one of cerebrospinal fluid or blood.

According to a still further embodiment, a non-transitory computer readable medium is disclosed. The non-transitory computer readable medium can include a program that, when executed, causes a computer to irradiate a plurality of RF pulses into a subject under observation, record a plurality of RF response signals from said subject under observation and analyze the plurality of RF response signals. The plurality of RF pulses can be arranged in a pulse sequence. The pulse sequence can include an excitation pulse and a plurality of refocusing pulses inducing a corresponding plurality of flip angles. A minimum flip angle of the plurality of flip angles can be in the range of 30 degrees to 65 degrees, and a maximum flip angle of the plurality of flip angles can be in the range of 100 degrees to 150 degrees. Analyzing the RF response signals can include analyzing the plurality of RF response signals with a three-dimensional isotropic resolution of 500 cubic microns or less and ordering the RF response signals in k-space in order to enhance contrast between intracranial vessel wall tissue and at least one of cerebrospinal fluid or blood.

BRIEF DESCRIPTION OF THE DRAWINGS

Further objectives and advantages will become apparent from a consideration of the description, drawings, and examples.

FIG. 11 is a table showing Morphologic measurements for intracranial vessel segments from 3D VISTA and 2D TSE images FIG. 12 is a table showing MRI measurement reliability based on VISTA acquired according to an embodiment of the current invention at 0.5 mm isotropic resolution

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1:
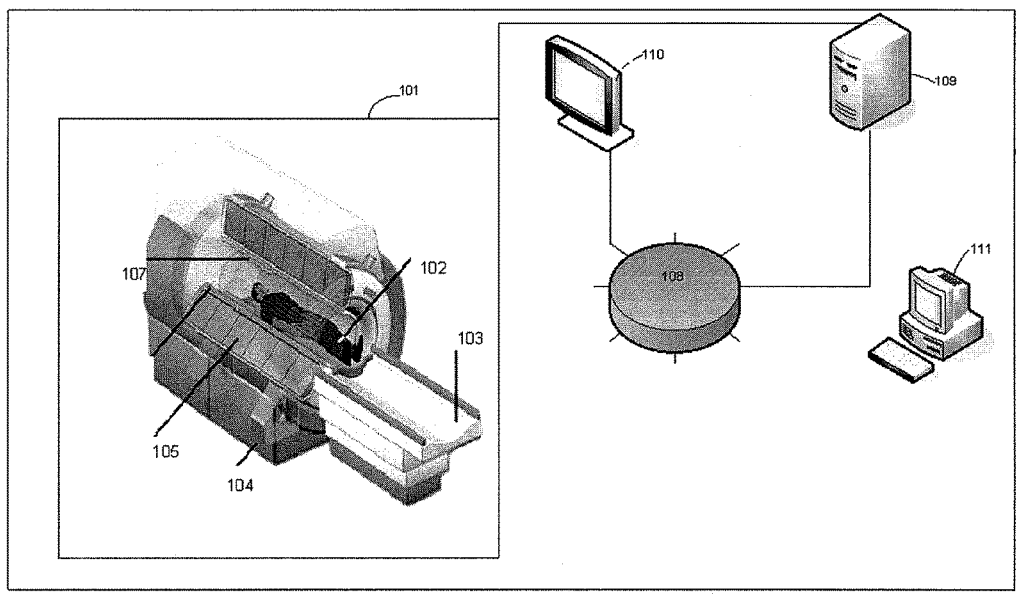
FIG. 1 is a schematic illustration of a magnetic resonance imaging (MRI) system according to some embodiments of the current invention.

FIG. 1 is a schematic illustration of a magnetic resonance imaging (MRI) system 100 according to an embodiment of the current invention.

The MRI system 100 includes a magnetic resonance scanner 101, capable of imaging a subject 102 under observation on scanner bed 103. MRI system 100 can be any suitable type of MRI system, for example a 1.5T MRI system, a 3T MRI system, a 7T MRI system, or any other type of MRI system. Magnetic resonance scanner 101 is located on base 104 and has a main magnet 105, and a radio-frequency (RF) coil system 107. Main magnet 105 provides a substantially uniform main magnetic field $B_o$ for subject 102. Radio-frequency (RF) coil system 107 transmits RF pulses into a region of interest of subject 102 under observation and receives radio freqency (RF) response signals from subject 102.

RF coil system 107 comprises at least one radio frequency (RF) coil configured to irradiate a radio frequency (RF) pulse into a region of interest of the subject 108. The RF coil may be, for example, a surface coil, a neck coil, an extremity coil, a head coil, a body, a phased-array coil, etc. The RF coil may be embodied as a solenoid, a planar coil, a volume coil, a quadrature coil, or variations thereof. The RF coil may be for transmission only or for both transmission and reception. RF coil system 107 may further comprise a power amplifier to amplify the RF pulse being transmitted or the received magnetic resonance signals. The power amplifier may be programmed or configured to amplify at more than one level of amplification. RF coil system 107 may further comprise matching and/or tuning networks for impedance matching and/or frequency tuning purposes.

The MRI system 100 may further include a data storage unit 108 and a signal processing unit 109. Data storage unit 108 is in communication with signal processing unit 109 to store magnetic signals from the region of interest of subject 102 under observation. The subject may be, for example, a human, an animal, a phantom, a sample, or combinations thereof. The region of interest may be, for example, a brain, a heart, a muscle, a liver, a kidney, a knee, a neck, etc.

Data storage unit 108 may be, for example, a hard disk drive, a network area storage (NAS) device, a redundant array of independent disks (RAID), a flash drive, an optical disk, a magnetic tape, a magneto-optical disk, etc. However, the data storage unit 108 is not limited to these particular examples. It can include other existing or future developed data storage devices without departing from the scope of the current invention.

Signal processing unit 109 is in communication with magnetic resonance scanner 101 to receive magnetic resonance signals from the region of interest in response to the RF pulse. Signal processing unit 109 may be partially or totally incorporated within a structure housing magnetic resonance scanner 101. Signal processing unit 109 may be at least partially incorporated in a workstation that is structurally separate from and in communication with magnetic resonance scanner 101. Signal processing unit 109 may be incorporated in a workstation that is structurally separate from and in communication with magnetic resonance scanner 101. A workstation can be a computer having at least one central processing unit (CPU) and one memory, for example, static random access memory (SRAM), dynamic random access memory (DRAM), erasable programmable random access memory (EPROM), non-volatile Flash memory, etc.

Signal processing unit 109 may reconstruct or otherwise analyze a plurality of images of the region of interest of the subject 108 based on the received RF response signals. Signal processing unit 109 can analyze the received RF response signals with a three-dimensional isotropic resolution of 500 cubic microns. Alternatively, signal processing unit 109 can analyze the received RF response signals with a lower three-dimensional isotropic resolution, for example 450 cubic microns, or 400 cubic microns. Analysis in three dimensions can assist in imaging of intracranial vessel walls. This is because the inherently curving/tortuous shape of intracranial vessels makes them very difficult to image with 2-dimensional techniques. For example, it is very challenging for an MRI technologist using an MRI system 100 to orient 2-dimensional image slices perpendicular to a small, curving vessel. Our 3-dimensional sequence requires an MRI technologist to simply position the sequence volume so it includes the intracranial vessels, and the entire circulation can be acquired all at once. The images can be postprocessed (i.e., in flexible imaging planes) because of their isotropic resolution.

Signal processing unit 109 can analyze the received RF response signals by ordering the RF response signals in k-space in order to enhance contrast between intracranial vessel wall tissue and at least one of cerebrospinal fluid or blood. As an example, signal processing unit 109 can order said plurality of RF response signals in k-space such that the highest amplitude RF response signals are located in the center of k-space. K-space ordering such as this can improve the delineation of the outer wall of an intracranial vessel because an intracranial vessel is surrounded by cerebrospinal fluid and this K-space ordering can assist in suppressing the signal of cerebrospinal fluid. This ordering can also increase the signal of the vessel wall itself.

The output from signal processing unit 109 may be visualized on a display device, such as, for example, viewing station 110 or a console station 111. Viewing station 110 or console station 111 may be, for example, a cathode ray tube (CRT) monitor, a liquid crystal display (LCD) monitor, a digital light projection (DLP) monitor, a plasma screen, an organic light emitting diode (OLED), etc. The processed results may be used for further analysis and diagnosis.

Figure 2:
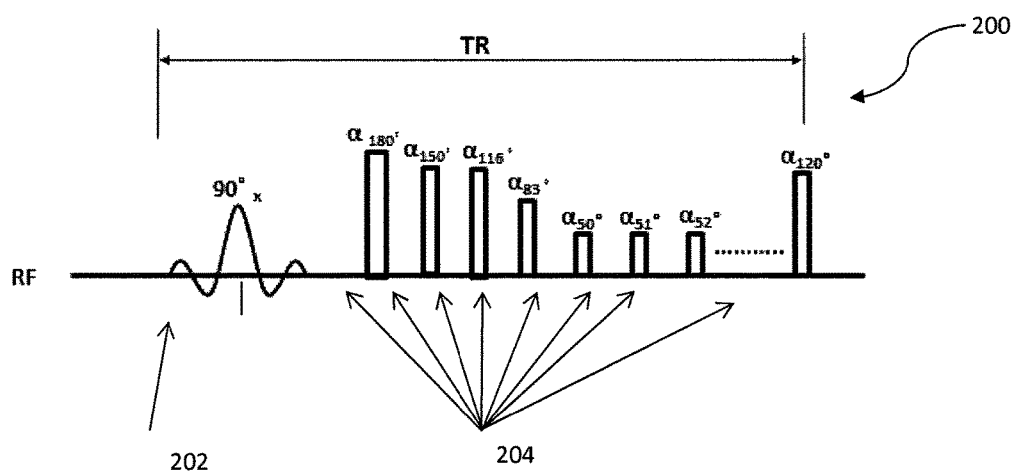
FIG. 2 is diagram of an embodiment of a pulse sequence.

FIG. 2 shows an example embodiment of a pulse sequence 200 which can be produced or irradiated by RF coil system 107. Pulse sequence 200 can include an excitation pulse 202 and a plurality of refocusing pulses 204. Pulse sequence 200 can have an echo train length, which can correspond to the number of refocusing pulses. The echo train length of pulse sequence 200 can be, for example, in the range of 50 pulses to 65 pulses. As another example, the echo train length of pulse sequence 200 can be in the range of 58 pulses to 62 pulses. As a still further example, the echo train length of pulse sequence 200 can be about 60 pulses. Echo train lengths of this length can facilitate increased flow-related dephasing and the formation of stimulated echoes, which can help to optimize black blood effects.

Pulse sequence 200 can have an associated echo time, which can correspond to the length of time between echoes generated by pulse sequence 200. For example, pulse sequence 200 can have an echo time in the range of 25 milliseconds to 40 milliseconds. As another example, pulse sequence 200 can have an echo time in the range of 35 milliseconds to 40 milliseconds. As a still further example, pulse sequence 200 can have an echo time of about 38 milliseconds.

Excitation pulse can be an RF pulse of sufficient duration and power to induce a flip angle, for example a 90 degree flip angle. Refocusing pulses 204 can also induce a plurality of flip angles. For example, the plurality of flip angles produced by refocusing pulses 204 can have a minimum flip angle in the range of 30 degrees to 65 degrees, and a maximum flip angle of said plurality of flip angles in the range of 100 degrees to 150 degrees. As another example, the plurality of flip angles produced by refocusing pulses 204 can have a minimum flip angle in the range of 45 degrees to 55 degrees, and a maximum flip angle of said plurality of flip angles in the range of 110 degrees to 130 degrees. As a further example, the plurality of flip angles produced by refocusing pulses 204 can have a minimum flip angle of about 50 degrees, and a maximum flip angle of said plurality of flip angles in the range of about 120 degrees.

Figure 3:
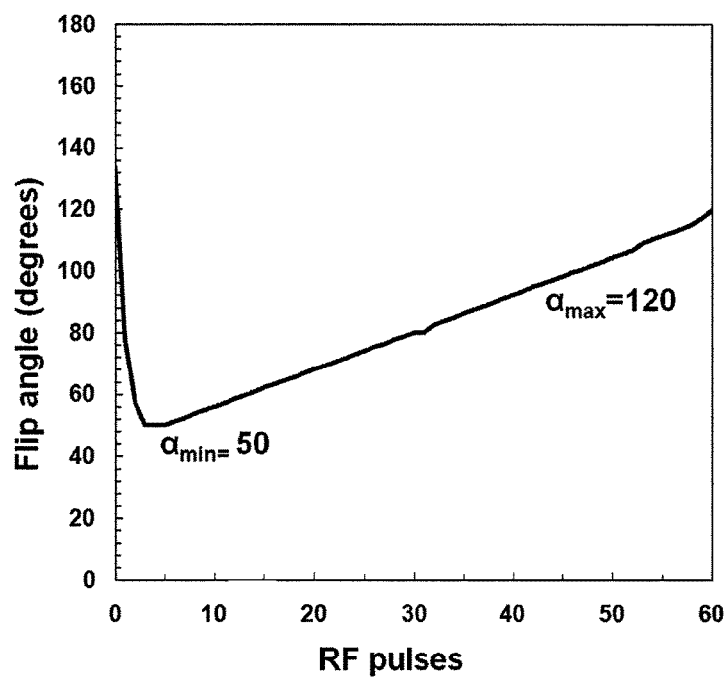
FIG. 3 shows an example refocusing variable-flip-angle scheme according to an embodiment of the current invention. Parameters: αmin=50°, αmax=120°, ETL=56+4 startup echoes.

FIG. 3 shows an example profile of flip angles which can be induced by the refocusing pulses 204 of pulse sequence 200. As can be seen the profile of flip angles can have an initial peak, can then drop to a minimum at approximately pulse 4 or 5, and can then increase substantially linearly to a maximum. Flip angle profiles such as those shown in FIG. 3 can assist in increasing signal provided by intracranial vessel walls, which can help distinguish them from surrounding tissue and fluids.

EXAMPLES

In these examples, our aim was to develop and optimize a high, isotropic resolution 3D BBMRI (i.e., Volumetric ISotropic TSE Acquisition (VISTA)) protocol to measure intracranial arterial wall size in a clinically-acceptable scan time, using a conventional 2D BBMRI sequence (i.e., double inversion TSE) as a reference.

In the following description, when we refer to 3D VISTA sequences and acquisitions we intend this to mean sequences, images, and other attributes according to embodiment of the current invention. The following is intended to be illustrative only, and is not intended to be limiting in any way. Aspects of embodiments of the current invention can include:

1. Echo Train Length of 60 and Echo time of 38 ms
   This can facilitate increased flow-related dephasing and the formation of stimulated echoes, optimizing the black blood effects (i.e., made the inside of the vessel look dark)
2. Repetition Time (TR) of about 1500-2000 milliseconds for T1 weighting
   This can allow for improved identification of vascular diseases after gadolinium-contrast administration (e.g., improved detection of areas of inflammation in the vessel wall)
3. Variable flip angle profile parameters of: center flip angle=50, minimum flip angle=50, and maximum flip angle=120. This can help to optimize vessel wall signal.
4. Radial K-space ordering. This can help to optimize the vessel wall signal and delineate its outer boundary by choosing radial view-ordering modulation in the phase-encoding and partition-encoding direction.
   This can improve the delineation of the outer wall of the vessel because the vessel is surrounded by cerebrospinal fluid and this K-space ordering can effectively suppress the signal of CSF. This can also increase the signal of the vessel wall itself.
5. Optimized spatial resolution of about 400 microns isotropic by using a half scan factor of 0.6 (i.e., partial fourier transform acquisition).
6. Sense factor of 2.0 in the right-to-left direction to shorten the scan time (i.e., this is a motion-sensitive exam and shorter scan times can consequently reduce image noise).
7. Tissue-specific option for the refocusing control to optimize the variable flip angle refocusing pulse.
   T1 and T2 values for intracranial vessel walls (e.g., 1200 ms-1500 ms and 40 ms-60 ms, respectively) can be entered so this imaging can be optimized for these structures.

Overview

Thirteen healthy volunteers and 4 patients with intracranial stenosis were imaged at 3.0 T using 0.5 mm isotropic-resolution 3D Volumetric ISotropic TSE Acquisition (VISTA), with conventional 2D-TSE for comparison. VISTA was repeated for 6 volunteers and 4 patients at 0.4 mm isotropic-resolution to explore the trade-off between SNR and voxel volume. Wall signal-to-noise-ratio (SNRwall), wall-lumen contrast-to-noise-ratio (CNRwall-lumen), lumen area (LA), wall area (WA), mean wall thickness (MWT), and maximum wall thickness (maxWT) were compared between 3D-VISTA and 2D-TSE sequences, as well as 3D images acquired at both resolutions. Reliability was assessed by intraclass correlations (ICC).

Compared with 2D-TSE measurements, 3D-VISTA provided 58% and 74% improvement in SNRwall and CNRwall-lumen, respectively. LA, WA, MWT and maxWT from 3D and 2D techniques highly correlated (ICCs of 0.96, 0.95, 0.96, and 0.91, respectively). CNRwall-lumen using 0.4 mm-resolution VISTA decreased by 27%, compared to 0.5 mm VISTA but with reduced partial-volume-based over-estimation of wall thickness. Reliability for 3D measurements was good to excellent.

3D-VISTA can provide SNR-efficient, highly reliable measurements of intracranial vessels at high isotropic-resolution, enabling broad coverage in a clinically-acceptable time.

Three-dimensional VISTA—Technical Considerations

The applied 3D isotropic resolution 3D VISTA sequence is a variant of TSE with variable-flip-angle (FA) non-selective refocusing RF pulses and radial view ordering. The variable refocusing FA modulation is designed to achieve a target signal level by a precipitous drop in the initial FAs, and then maintain a pseudo-steady-state signal level over the remainder of the echo train by gradually increasing FAs. This minimizes signal blurring from T2 decay while reducing RF power(21).

The primary mechanisms for the intrinsic black-blood effects of 3D VISTA include: (i) Intravoxel dephasing of moving blood spins. Blood with a spectrum of velocities and accelerations flowing across a magnetic field gradient leads to widespread phase dispersion that results in signal loss. In particular, the complex state of motion such as turbulence or pulsation contributes to the spread of velocities and accelerations, and serendipitously induces additional signal attenuation(16). Furthermore, the flow suppression is more effective for vessels with small diameters, such as cerebral vessels(22). (ii) The use of low FA refocusing pulses causes the formation of simulated echoes, which store magnetization along the longitudinal axis and exhibits a complicated phase evolution between the longitudinal and transverse planes that results in signal loss(17). Furthermore, the FA impacts flow-related signal loss, and a smaller FA leads to greater flow suppression(17,23).

The signal of the vessel wall achieved using the VISTA sequence can be optimized by enabling radial-ordering modulation in which the center of K space is sampled at the beginning of the echo train(17). This has the added benefit of minimizing the T2-weighting of the image, thereby darkening the signal of the surrounding CSF.

The VISTA pulse sequence implemented herein was based on the 3D proton density-weighted TSE technique described by Busse et al(17), that uses a variable FA refocusing control, autocalibrating 2D-accelerated parallel imaging, and radial view ordering to produce isotropic high-resolution images. Parameters (e.g., TE, ETL and resolution) were modified to facilitate intracranial wall imaging.

Study Population

Thirteen healthy volunteers (8 males; ages 22-82 years, mean 44 years) with no history of intracranial vascular disease were recruited. Four patients (1 male; ages 38, 42, 44 and 61 years) with intracranial stenosis based on a preceding MRA or CTA were recruited (one BA stenosis, three MCA stenoses). Institutional review board approval was obtained and participants provided informed consent.

MRI Examination

All exams in these examples were performed on a 3T MRI scanner (Achieva; Philips Healthcare, The Netherlands) using the body coil for transmission and an eight-channel head coil for reception. A 3D Time-of-flight (TOF) MR angiogram (MRA) was first acquired to localize the intracranial arteries. 3D VISTA images were then acquired in a coronal plane (45-mm-thick slab) to cover the major intracranial vessels as identified on the TOF MRA. Imaging parameters were as follows: TR/TE, about 2000 ms/ about 38 ms; TSE factor, about 60 including 4 startup echoes; echo spacing, about 6.1 ms; sense factor, 2 (right-left direction); oversampling factor, about 1.8; and number of averages, about 1. The FOV was about 200×166×45 mm3 at a matrix of about 400×332×90 for an acquired voxel volume of about 0.5×0.5×0.5 mm3 (scan time, about 7.9 minutes). To explore the trade-off between SNR and voxel volume, a VISTA sequence was repeated with an acquired resolution of about 0.4×0.4×0.4 mm3 for 6 volunteers and 4 patients using a half scan factor (partial Fourier) of 0.6 to approximate the same coverage and scan time (scan time, about 7.6 minutes). The variable-flip-angle scheme for the VISTA acquisitions is illustrated in FIG. 3. Radial k-space ordering was used in the phase-encoding and partition-encoding directions, and no fat suppression or electrocardiography (ECG) trigger was applied.

Figure 4:
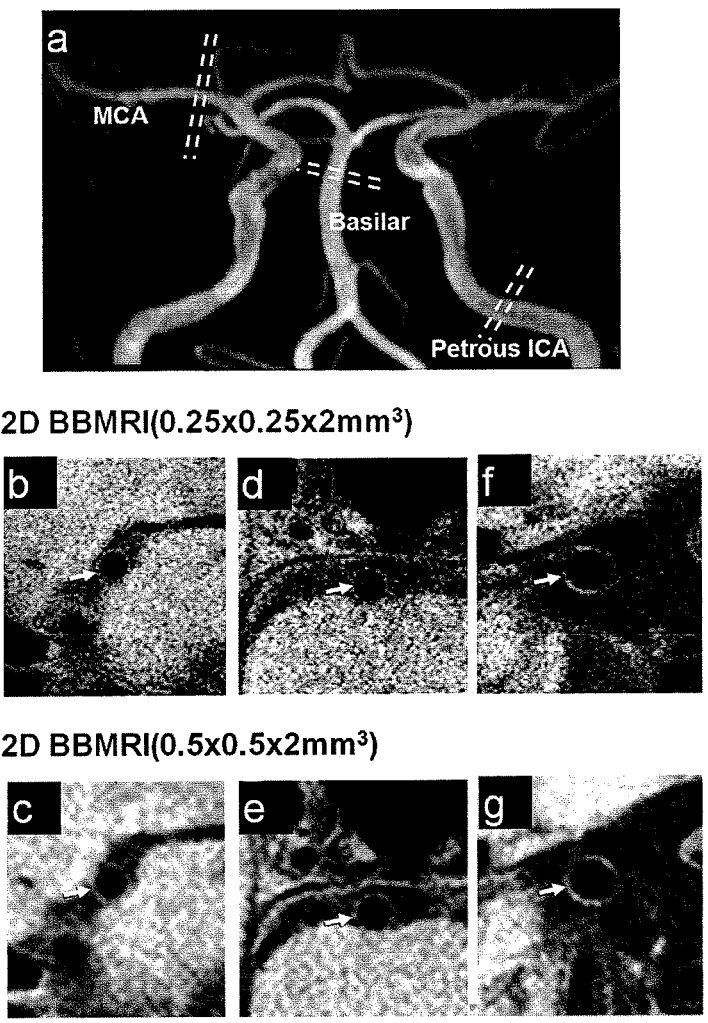
FIG. 4 shows 3D TOF MRA collapsed Maximum Intensity Projection (MIP) image (AP view) and demonstrates normal intracranial vessels in a 38 year old male (a). 2D black blood MRI (BBMRI) images were acquired at two in-plane resolutions (0.25×0.25 mm vs, 0.5×0.5 mm) and oriented orthogonal to the M1 segment of the MCA (b, c), distal BA (d,e) and horizontal petrous ICA (f,g) as prescribed on the TOF MRA (a, lines). Cross-sectional view of vessel of interest is identified by arrow.

2D BBMRI images were acquired for all volunteers using an ECG-gated double inversion recovery TSE sequence with the following parameters: TR/Turbo factor/TE: 2 RR/10/9 msec; FOV, 120×90 mm2; 1 excitation; slice thickness, 2 mm with 0 gap; number of averages, 2. Two sets of 2D BBMRI images were acquired with resolutions of 0.25× 0.25×2 mm3 and 0.5×0.5×2 mm3, and scan times of 74 seconds/slice and 37 seconds/slice, respectively. The MRI slices were oriented perpendicular to the vessel axis at three standard locations that represent common sites for intracranial atherosclerosis(12) (FIG. 4): a) basilar trunk, 5-6 mm proximal to its terminal bifurcation; b) M1 segment of MCA, 5-6 mm beyond the origin of M1; c) horizontal petrous segment of the ICA, 4-5 mm proximal to the cavernous segment. The side of the MCA and ICA used for imaging was randomly chosen prior to imaging for each segment. Two MRI slices were obtained at each location. For patients, 3-5 2D BBMRI slices were acquired centered at the most stenotic regions.

In addition, a 3D fluid-attenuated inversion recovery (FLAIR) VISTA sequence (acquired resolution, 0.5×0.5×0.5 mm3), was also acquired in 2 volunteers to study the effect of CSF suppression on SNR and the visual conspicuity of the vessel wall.

Image Analysis
Comparison between 3D VISTA and 2D TSE

Figure 5:
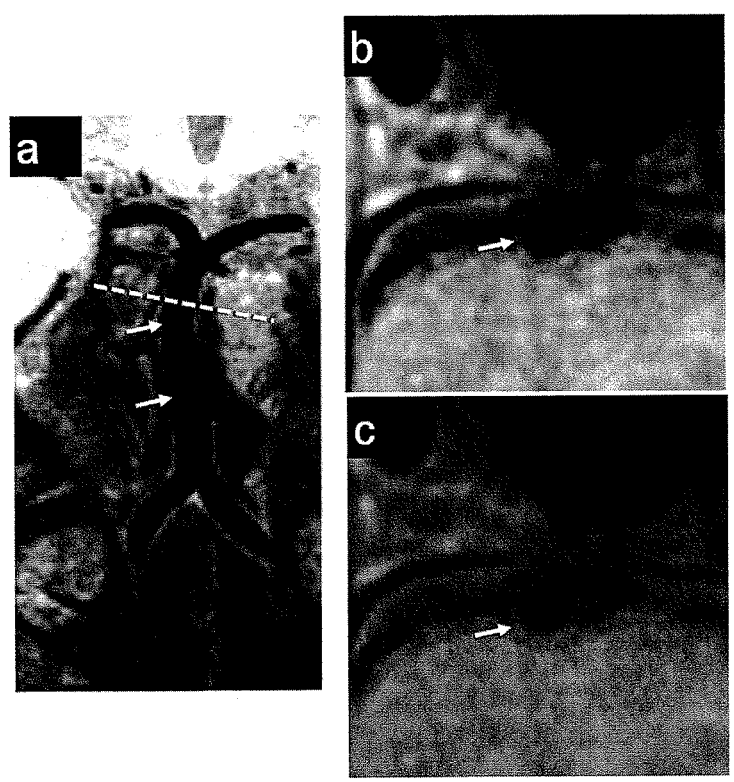
FIG. 5 shows 3D VISTA images (0.5 mm isotropic resolution) of a BA in a 38 year old healthy volunteer. A 3D VISTA image is reconstructed according to an embodiment of the current invention to visualize the long axis of the BA (arrows, a). Short axis VISTA images are reconstructed according to an embodiment of the current invention to 0.5 mm-thickness (b) and 2 mm-thickness (c) at the same position as the 2D TSE image (FIG. 2d, 2e) using the Multi-Planar Reformations (MPR) tool (dashed line, a). Cross-sectional view of BA is identified by arrow (b, c).

MRI images were processed using customized software (VesselMass, Leiden University Medical Center, the Netherlands). 3D VISTA images (acquired resolution, 0.5 mm isotropic) were reconstructed to 0.5 mm- and 2 mm-slice thicknesses at orientations identical to the 2D TSE slices using the Multi-Planar Reformations (MPR) tool (FIG. 5). For signal comparison, the reconstructed 0.5 mm-thick VISTA images (0.5×0.5×0.5 mm3) were matched with the native 2D TSE images (0.25×0.25×2 mm3), having identical voxel volumes. For morphologic comparison, the reconstructed 2 mm-thick VISTA images (0.5×0.5×2 mm3) were matched with the native 2D images (0.5×0.5×2 mm3) for the same in-plane resolution and slice thickness to test whether they provided comparable wall thickness and lumen and wall area measurements. To minimize recall bias, the 2D TSE and reconstructed VISTA images were analyzed in separate sessions by at least two weeks.

Figure 6:
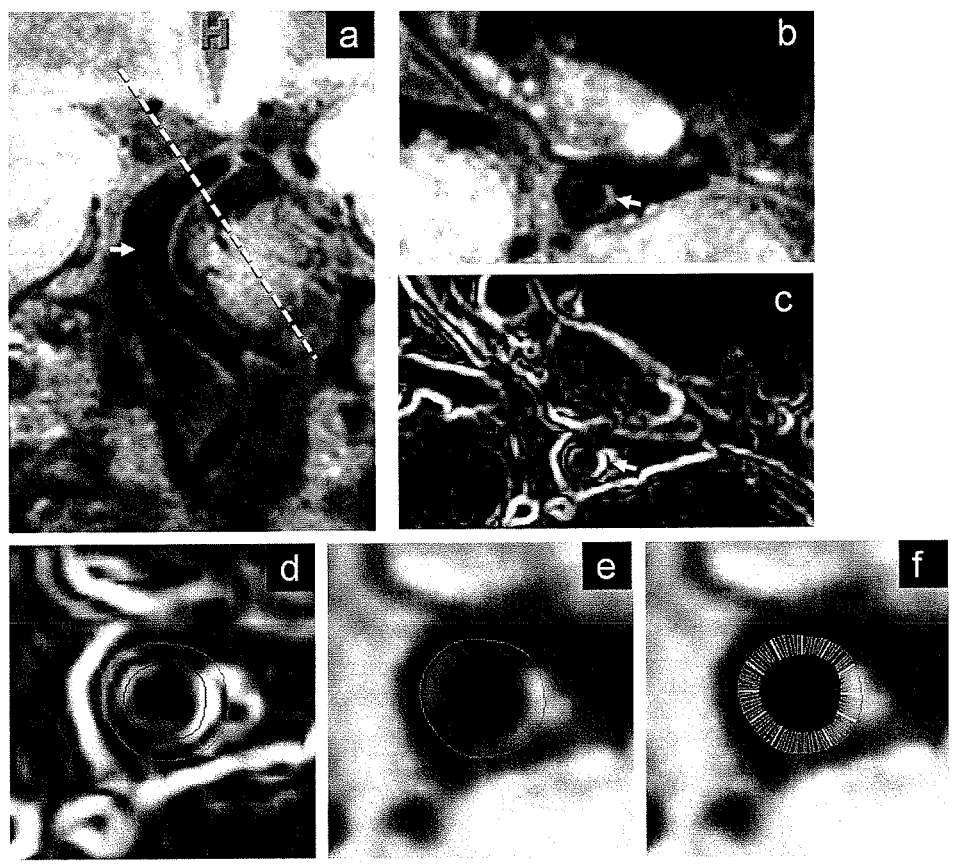
FIG. 6 shows 3D VISTA images (0.5 mm isotropic resolution) according to an embodiment of the current invention of a basilar artery in an 82 year old healthy volunteer. Long-axis view of the basilar artery (a) to orient short axis view (b, reconstructed at line shown in a). A gradient image (c) is generated using Sobel operator (24) to guide contour placement (d) using VesselMass software (Leiden University, the Netherlands). Contours are transferred to the magnitude image (e), and then used to divide the vessel wall into 12 radial segments with thickness and area measurements generated by VesselMass software (f). Basilar artery, arrow.

Images were analyzed by two readers using a semi-automated contouring feature of VesselMass software. Contours were generated using a gradient image that displays the spatial derivatives in image intensity (i.e., edges) extracted from the original gray-scale image. These edges provide an objective definition for soft tissue boundaries, which eliminates the influence of subjective window/level settings for vessel contour detection (24). Lumen and outer wall contours were drawn using the gradient image by bisecting the band of high intensity that represents the lumen and wall interface, as well as the band representing the interface between the wall and surrounding tissue (FIG. 6d). Lumen area (LA), wall area (WA), mean wall thickness (MWT) and maximum wall thickness (maxWT) values were generated (FIG. 6). For regions without a clear boundary (e.g. 2-4 clock in FIG. 6d), the contour was traced to maintain the continuity of the vessel's curvature based on the magnitude image.

The SNR of lumen (SNRlumen) and wall (SNRwall) measurements were calculated: SNR=S/SDnoise, where S is the averaged signal intensity of the region of interest, and SDnoise is the standard deviation of noise. Because of the inhomogeneous noise distribution encountered in parallel imaging, we measured noise from an ROI of 25 mm2 manually placed in the adjacent white matter (20,25) instead of using the air. The contrast-to-noise ratio (CNR) of wall versus lumen (CNRwall-lumen) was calculated as CNRwall-lumen=SNRwall-SNRlumen. The CNR efficiency (CNReff) was determined to account for differences in scan times between 2D and 3D techniques to enable a fair comparison. CNReff was calculated as: CNReff=CNR/ (VOXEL(TAslice)1/2), where VOXEL is the voxel volume (in mm3) and TAslice is the scan time per slice (in minute) (20).

Comparison Between VISTA Acquired at 0.4 and 0.5 Isotropic Resolution

The 3D VISTA dataset acquired at 0.4-isotropic resolution was reconstructed at 0.4 mm-thick slices at three standard locations as prescribed for the 0.5-isotropic 3D VISTA images (i.e., based on the positioning of the 2D slices). In addition, the native coronal view image that best displayed the supraclinoid ICA segment in cross section was selected from the two 3D datasets, and the slice locations were matched. Therefore, four vessel segments were analyzed from the participants who underwent both 0.4-isotropic and 0.5-isotropic VISTA imaging. Signal and morphologic measurements were assessed in the same manner as described in the previous section.

Statistical Analysis

Data were analyzed using SPSS 18.0 (SPSS Inc, Chicago, Ill.). All signal-based measurements (SNRlumen, SNRwall, CNRwall-lumen and CNReff(wall-lumen)) were determined for each slice (n≤6) and a single value was used for each participant based on the average of all slices. Morphological variables (LA, WA, MWT and maxWT) were reported as the average of both slices for each vessel segment (i.e., MCA, BA, petrous ICA and supraclinoid ICA), as wall thickness may vary by location. All signal-based and morphological measurements were compared between 3D VISTA and 2D TSE sequences using two-tailed paired t-tests. The same test was conducted to compare the VISTA images acquired at 0.4-isotropic versus 0.5-isotropic resolution. Agreement between MRI measurements obtained from 2D and 3D techniques were assessed using Bland-Altman plots(26) and intraclass correlation coefficients (ICC)(27). Inter- and intra-reader variability was assessed using ICC , and reliabilities below 0.4 were characterized as poor, 0.4 to 0.75 as fair to good, and above 0.75 as excellent(28). Repeated measures ANOVA was used to calculate between-subject variance and between-reader variance for MWT of each vessel segment and each spatial resolution. Data are presented as means±standard deviations.

Results

The 3D VISTA images were successfully acquired from 17 participants (13 volunteers and 4 patients). The major intracranial vessel walls were clearly visualized in all participants, and no atherosclerotic plaques were noted in healthy volunteers. Minimal flow artifact was identified in two cases as a wisp of faint signal projecting into the lumen from the inferior vessel wall at the junction between the horizontal and vertical segments of the petrous ICA, but not elsewhere including in the MCA, BA and ICA beyond the petrous segments for all participants.

Comparison Between VISTA and 2D TSE

3D VISTA 0.5 mm isotropic-resolution images were reconstructed and matched with corresponding 2D MRI images in 12 volunteers. One volunteer moved between the VISTA and 2D TSE sequences, prohibiting comparison. Only those cases with adequate image quality on the 2D TSE sequence were compared. A total of 54 pairs of 2D and 3D images at the MCA, BA and petrous ICA locations were used for comparison.

Figure 7:
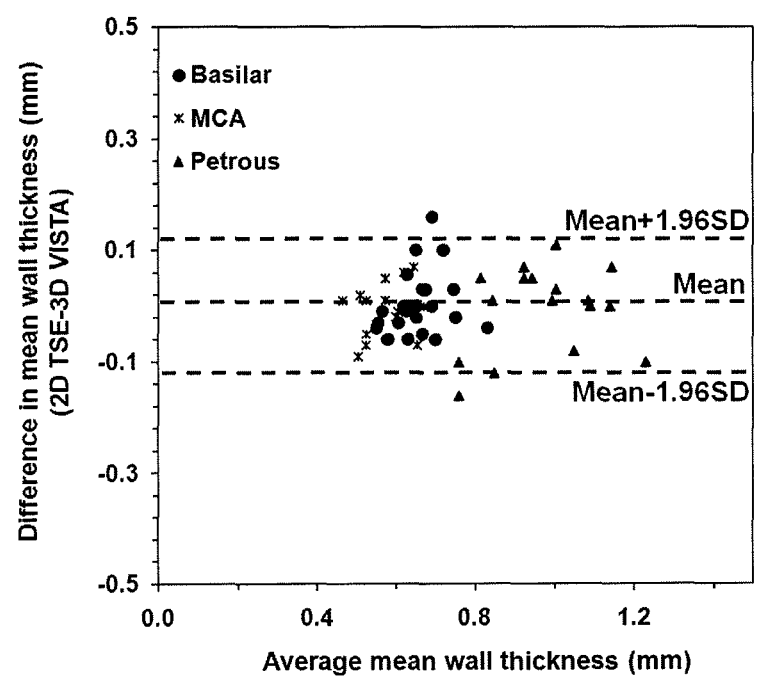
FIG. 7 shows Bland-Altman plot of the percent difference versus mean for the 2D and 3D paired MWT measurements. 3D images (0.5 mm isotropic resolution) were reconstructed to match the voxel dimensions of the 2D sequence (0.5× 0.5×2 mm). Measurement pairs show good agreement.

Compared with 2D TSE (0.25×0.25×2.0 mm3) image measurements, 3D VISTA images acquired at the same voxel volume (0.5×0.5×0.5 mm3) and reconstructed to the same location provided 58% improvement in SNRwall (6.34±1.84 vs. 10.01±2.45, p<0.01), 74% improvement in CNRwall-lumen (3.70±1.20 vs. 6.45±1.84, p<0.01), and 484% improvement in CNReff (wall-lumen) (45.69±13.26 vs. 266.93±65.33, p<0.01). A difference in SNRlumen could not be detected between the 3D and 2D acquisitions (3D VISTA, 2.89±1.40 vs. 2D TSE, 2.68±0.82). For a comparison of morphology, the 3D VISTA images reconstructed to the same voxel dimension as the 2D TSE images (0.5×0.5×2.0 mm3) revealed excellent agreement between measurements of LA, WA, MWT and maxWT for each vessel segment (ICCs of 0.96, 0.95, 0.96, and 0.91, respectively; FIG. 11). There was no difference in LA, WA, MWT and maxWT measurements for BA, petrous ICA and MCA segments compared between 2D and 3D acquisitions (p value not significant). Bland-Altman analysis showed good agreement without a bias between techniques (Mean wall thickness shown in FIG. 7).

Comparison Between 0.4 Mm and 0.5 Mm Isotropic Resolution VISTA Sequences

Figure 8:
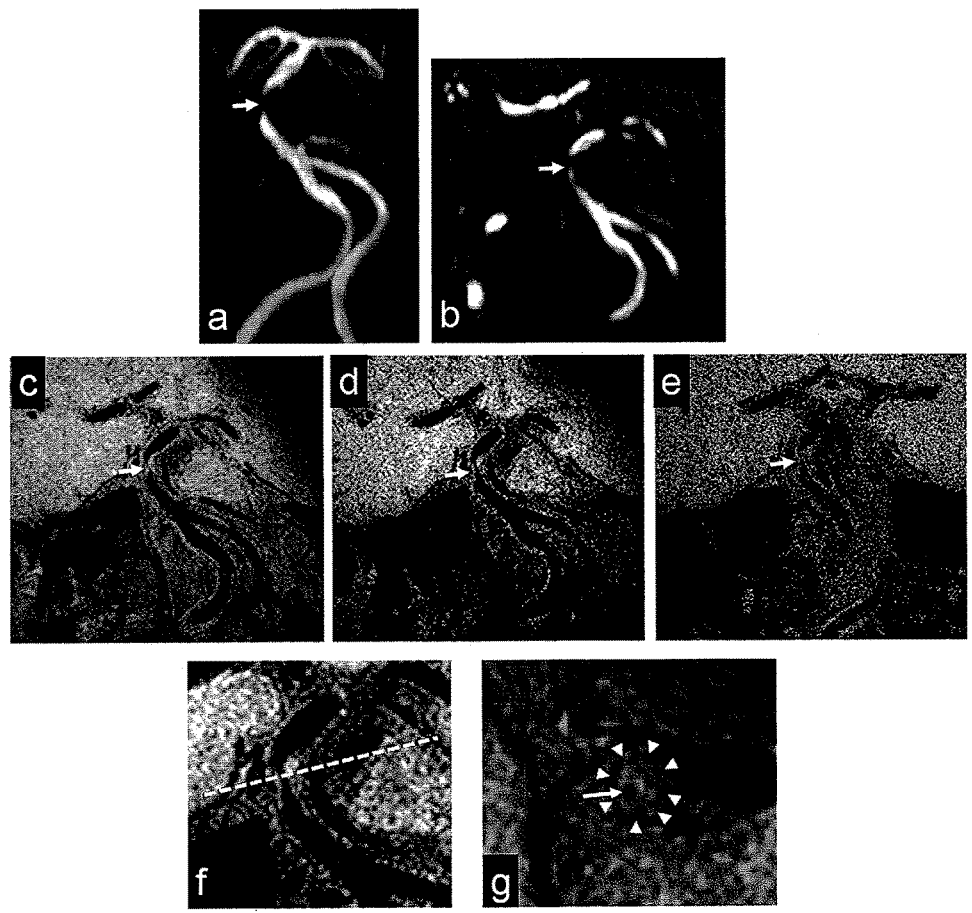
FIG. 8 shows TOF MRA MIP (acquired resolution, 0.52× 0.70×1.4 mm) of the basilar artery demonstrates a high-grade stenosis of its mid segment (arrow, a) in a 42 year old patient. A multiplanar reconstruction of the MRA dataset oriented through the long axis of the basilar artery depicts the narrowing at its mid segment (arrow, b). Reconstructed 3D VISTA image according to an embodiment of the current invention at 0.5 mm isotropic resolution (c) at the same position as the MRA reconstruction (b) demonstrates wall thickening responsible for the high-grade stenosis (arrow, c). Reconstructed 3D VISTA image according to an embodiment of the current invention at 0.4 mm isotropic resolution (d) at the same position shows improved delineation of the lumen at the point of narrowing (arrow, d) due to reduced partial volume effects. A 2D BBMRI slice (0.25×0.25×2.0 mm) acquired coronals at this location (not for the purpose of this study) is also shown (e) for comparison, but suffers from insufficient SNR. Magnified long-axis 3D VISTA 0.4 mm-resolution reconstruction image shows the slice orientation (line, f) used to position a short axis reconstruction of the VISTA dataset through the mid-basilar plaque (g, arrowheads delineate outer wall, arrow points to lumen).
Figure 9:
FIG. 9 shows 3D VISTA image according to an embodiment of the current invention of the basilar artery (arrow) shown in FIG. 4 reconstructed in the same long-axis plane but acquired at a higher resolution ((0.4 mm isotropic). Note the sharper delineation of the wall compared with FIG. 4a. Also noteworthy is the slight asymmetry in wall thickness of this curved vessel, with the thicker side along its concave bend where there is compensatory thickening likely due to the greater tensile stresses as described for bending vessels (40).

The 3D VISTA images acquired at 0.4 mm resolution in 6 volunteers were reconstructed at 4 locations (BA, MCA, petrous ICA, and supraclinoid ICA) and matched with corresponding images reconstructed at 0.5 mm resolution (37 image pairs). Compared with 0.5 mm resolution image measurements, 0.4 mm resolution images showed a 27% decrease in CNRwall-lumen (6.43±2.16 vs. 4.67±1.25, p<0.01). For morphologic measurements, the MWT combined per arterial location for all participants obtained from 0.4-mm images decreased by an average of 10.2% compared with corresponding 0.5 mm images (paired differences were significant, p<0.05). We observed a qualitative improvement in plaque delineation for the patient exams due to diminished partial volume effects related to the improved resolution at 0.4 mm (FIGS. 8 and 9).

Comparison Between FLAIR-VISTA and VISTA at 0.5 mm Isotropic Resolution

CSF suppression was applied to the VISTA sequence and resulted in poor conspicuity of the vessel wall with a 76% reduction in SNRwall (15.88±1.69 vs. 3.81±0.09, p<0.05) and an 83% reduction in CNRwall-lumen (11.87±0.13 vs. 2.03±0.14, p<0.05). We simulated the wall signal using the formulas for steady-state excitation and inversion recovery (29) and calculated a 72% signal reduction when using CSF suppression (assuming a TR of 2000 ms, a T1CSF of 4300 ms(30), and a T1 wall of 1198 ms (31,32)).

MRI Measurement Reproducibility

Intra- and inter-reader reliability (ICC) for MRI measurements (e.g., MWT, LA and WA) of petrous ICA, supraclinoid ICA, and BA segments ranged from 0.84 to 0.98 (FIG. 12). Reliability estimates were lower for MCA measurements, which seemed due to its confluence with adjacent brain parenchyma with little surrounding CSF reducing conspicuity of its outer wall.

Between-subject variance of MWT was 0.125 mm, 0.042 mm, 0.068 mm, and 0.064 mm based on 0.5-isotropic VISTA images, and was 0.122 mm, 0.022 mm, 0.048 mm and 0.033 mm based on 0.4-isotropic VISTA images for petrous ICA, supraclinoid ICA, BA, and MCA segments, respectively. Between-reader variance was approximately 0.04 mm for all segments at both resolutions: 0.035 mm, 0.041 mm, 0.037 mm and 0.040 mm based on 0.5-isotropic VISTA images, and 0.0.041 mm, 0.044 mm, 0.037 mm and 0.041 mm based on 0.4-isotropic VISTA images for petrous ICA, supraclinoid ICA, BA, and MCA segments, respectively.

Discussion

In these examples, we discuss a new MRI method for high-isotropic resolution imaging of intracranial arterial walls at 3T without the anticipated difficulties of suboptimal flow suppression or signal constraints inherent to 3D techniques. This acquisition can cover a large volume of intracranial vessels, inclusive of the typical sites of atherosclerosis formation, in a clinically-acceptable scan time of approximately 7 minutes to provide highly reliable measurements of vessel wall size. In particular, the superior SNR efficiency afforded by the variable-flip-angle refocusing pulses, along with the inherent ability to reconstruct this isotropic imaging volume in any plane, enable better vessel wall visualization compared to 2D TSE black blood sequences employed for intracranial arterial imaging.

Once thought to be uncommon, intracranial atherosclerotic disease is now known to be as prevalent as extracranial atherosclerosis (33,34). Despite a growing recognition of the importance of identifying intracranial atherosclerosis (34), only a few studies have attempted to image intracranial atherosclerosis using MRI (7-9,35,36). Until now a 2D BBMRI technique has been the only approach employed, but its application is limited by (i) low spatial resolution in the slice-select direction (in general, 2 or 3 mm), thus making 2D images more prone to obliqueness artifact from partial volume effects, which is particularly troublesome for the inherently tortuous intracranial vessels; (ii) Long acquisition times needed to achieve high resolution with sufficient SNR to measure the wall and depict fine intracranial lesions; (iii) Difficulty positioning 2D slices in one scan to capture multiple intracranial vessels with varying orientations (basilar, MCA or ICA segments). In comparison, our sequence has demonstrated high intrinsic SNR/CNR efficiency, allowing for volume acquisitions with 0.4-0.5mm resolution along the slice direction and with broad coverage (45-mm) in one acquisition. Our test against the 2D technique was particularly rigorous considering there were some 2D-3D paired cases not analyzed because of inadequate 2D image quality. Of note, with the aid of MPR, 3D acquisitions enable retrospective visualization of the vessel wall and lumen in flexible planes, therefore allowing for accurate monitoring of disease progression and regression.

3D BBMRI techniques have been developed for extracranial arterial wall imaging and are commonly steady-state free precession (SSFP) sequences combined with a black blood preparation pulse(37,38). However, SSFP for intracranial vessel wall imaging is hampered by strong susceptibility effects from air (e.g., sinuses) and adjacent bony structures (e.g., skull base), particularly at high fields such as 3.0 T. In contrast, a 3DTSE technique with a dedicated refocusing sweep and a long echo train (e.g., VISTA) is less sensitive to these field inhomogeneities(19,20). Our study is the first application of the VISTA sequence for intracranial vessel wall imaging.

It is known that 3D TSE has intrinsic black-blood effects from the dephasing of moving blood spins (16,22). With VISTA, the intrinsic black-blood effect is further enhanced by the long echo train. Additionally, the low-flip-angle refocusing pulses induce stimulated echoes that increase the phase dispersion (17). The tortuous nature of intracranial vessels promotes appreciable secondary flows that lead to increased dephasing of spins, particularly when the vessels are small (22). In our study, blood signal was effectively suppressed through the 4.5-cm slab with flow suppression comparable to that of the 2D TSE sequence and even provided superior contrast between wall and lumen compared to that achieved by 2D TSE.

Although CSF suppression could theoretically improve the conspicuity of the intracranial vessel wall, our results demonstrated a deleterious effect because of the SNR penalty. In order to gain contrast between the wall and CSF, we chose radial instead of linear view ordering to obtain T1/PD-weighted images where CSF appeared dark(17). Surrounding CSF seemed to improve wall conspicuity, which was the reason we found MCA thickness measurement reliability to be less than for other vascular segments. We would expect this to improve for the MCA in older individuals with more CSF surrounding the vessel due to age-related brain involution, especially compared with the relatively young volunteers in our study.

Figure 10:
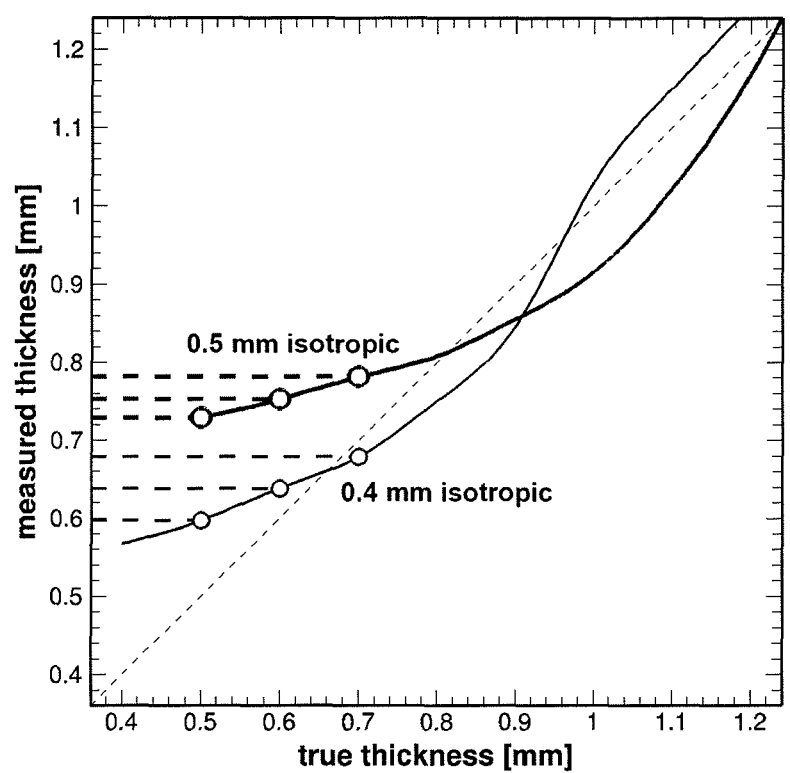
FIG. 10 shows an effect of spatial resolution on wall thickness measurement. Curves obtained using the techniques outlined in Antiga et al.(11) for the case of vessel segmented without using Gaussian smoothing. Symbols are placed at true thicknesses of 0.5, 0.6 and 0.7 mm, with horizontal dashed lines identifying the thickness that would be measured at that true wall thickness.

Our results show the 3D VISTA sequence can detect lesions and measure the intracranial vessel wall in normal human arteries. It may provide a reference standard of the normal vessel wall to discern pathological changes. Furthermore, we observed that reducing the resolution from 0.5-mm to 0.4-mm isotropic should allow for a reduction in partial-volume-based overestimation of wall thickness and a sharper depiction of wall features (FIGS. 8 and 9). As illustrated in FIG. 10, for a typical normal cerebral artery wall thickness of 0.5-0.7 mm, the measured thickness decreases by 15-20% in going from 0.5 to 0.4-mm resolution. This is broadly consistent with our measured 10-20% reductions. More importantly, as can be seen by the leveling off of the curves in FIG. 10, inadequate spatial resolution serves to "compress" differences in true wall thickness, consequently decreasing the ability to resolve actual differences in wall thickness. Consider, for example, the task of discriminating between a 0.5 and 0.6 or 0.6 and 0.7 mm wall. Referring to FIG. 10, at 0.5-mm spatial resolution, the apparent difference would be on the order of 0.02 mm, well below the precision of the measurements. At 0.4-mm spatial resolution, however, the apparent difference is on the order of 0.4 mm, close to the inter-reader variability. In other words, for discriminating differences in cerebrovascular wall thickness, 0.4-mm spatial resolution appears to offer a twofold increase in apparent resolving power compared to 0.5-mm spatial resolution.

In conclusion, our sequence offers high isotropic spatial resolution with excellent flow suppression to reliably measure intracranial vessel wall thickness and depict lesions with broad coverage in approximately 7 minutes at 3.0T. This technique may provide important insight into stroke risk by enabling the assessment of plaque burden not otherwise achievable by conventional angiographic techniques.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

REFERENCES

1. Sacco R L, Kargman D E, Gu Q, Zamanillo M C. Race-ethnicity and determinants of intracranial atherosclerotic cerebral infarction. The Northern Manhattan Stroke Study. Stroke 1995;26(1):14-20.
2. Mazighi M, Labreuche J, Gongora-Rivera F, Duyckaerts C, Hauw J J, Amarenco P. Autopsy prevalence of intracranial atherosclerosis in patients with fatal stroke. Stroke 2008;39(4): 1142-1147.
3. Wasserman B A, Wityk R J, Trout H H, 3rd, Virmani R. Low-grade carotid stenosis: looking beyond the lumen with MRI. Stroke 2005;36(11):2504-2513.
4. Yuan C, Zhang S X, Polissar N L, Echelard D, Ortiz G, Davis J W, Ellington E, Ferguson M S, Hatsukami T S. Identification of fibrous cap rupture with magnetic resonance imaging is highly associated with recent transient ischemic attack or stroke. Circulation 2002;105(2):181-185.
5. Wasserman B A, Astor B C, Sharrett A R, Swingen C, Catellier D. MRI measurements of carotid plaque in the atherosclerosis risk in communities (ARIC) study: methods, reliability and descriptive statistics. J Magn Reson Imaging 2010;31(2):406-415.
6. Xu W H, Li M L, Gao S, Ni J, Zhou L X, Yao M, Peng B, Feng F, Jin Z Y, Cui L Y. In vivo high-resolution MR imaging of symptomatic and asymptomatic middle cerebral artery atherosclerotic stenosis. Atherosclerosis 2010; 212(2):507-511.
7. Swartz R H, Bhuta S S, Farb R I, Agid R, Willinsky R A, Terbrugge K G, Butany J, Wasserman B A, Johnstone D M, Silver F L, Mikulis D J. Intracranial arterial wall imaging using high-resolution 3-tesla contrast-enhanced MRI. Neurology 2009;72(7):627-634.
8. Ryu C W, Jahng G H, Kim E J, Choi W S, Yang D M. High resolution wall and lumen MRI of the middle cerebral arteries at 3 tesla. Cerebrovasc Dis 2009;27(5):433-442.
9. Li M L, Xu W H, Song L, Feng F, You H, Ni J, Gao S, Cui L Y, Jin Z Y. Atherosclerosis of middle cerebral artery: evaluation with high-resolution MR imaging at 3T. Atherosclerosis 2009;204(2):447-452.
10. Saam T, Habs M, Pollatos O, Cyran C, Pfefferkorn T, Dichgans M, Dietrich O, Glaser C, Reiser M F, Nikolauo K. High-resolution black-blood contrast-enhanced T1 weighted images for the diagnosis and follow-up of intracranial arteritis. Br J Radiol 2010;83(993):e182-184.
11. Antiga L, Wasserman B A, Steinman D A. On the overestimation of early wall thickening at the carotid bulb by black blood MRI, with implications for coronary and vulnerable plaque imaging. Magn Reson Med 2008;60 (5):1020-1028.
12. Caplan L R. Intracranial large artery occlusive disease. Curr Neurol Neurosci Rep 2008;8(3):177-181.
13. Crowe L A, Gatehouse P, Yang G Z, Mohiaddin R H, Varghese A, Charrier C, Keegan J, Firmin D N. Volume-selective 3D turbo spin echo imaging for vascular wall imaging and distensibility measurement. J Magn Reson Imaging 2003;17(5):572-580.
14. Edelman R R, Chien D, Kim D. Fast selective black blood MR imaging. Radiology 1991;181(3):655-660.
15. Wasserman B A, Smith W I, Trout H H, 3rd, Cannon RO, 3rd, Balaban RS, Arai AE. Carotid artery atherosclerosis: in vivo morphologic characterization with gadolinium-enhanced double-oblique MR imaging initial results. Radiology 2002;223(2):566-573.
16. Alexander A L, Buswell H R, Sun Y, Chapman B E, Tsuruda J S, Parker D L. Intracranial black-blood MR angiography with high-resolution 3D fast spin echo. Magn Reson Med 1998;40(2):298-310.
17. Busse R F, Brau AC, Vu A, Michelich C R, Bayram E, Kijowski R, Reeder S B, Rowley H A. Effects of refocusing flip angle modulation and view ordering in 3D fast spin echo. Magn Reson Med 2008;60(3):640-649.
18. Busse R F, Hariharan H, Vu A, Brittain J H. Fast spin echo sequences with very long echo trains: design of variable refocusing flip angle schedules and generation of clinical T2 contrast. Magn Reson Med 2006;55(5):1030-1037.
19. Fan Z, Zhang Z, Chung Y C, Weale P, Zuehlsdorff S, Carr J, Li D. Carotid arterial wall MRI at 3T using 3D variable-flip-angle turbo spin-echo (TSE) with flow-sensitive dephasing (FSD). J Magn Reson Imaging 2010;31(3):645-654.
20. Zhang Z, Fan Z, Carroll T J, Chung Y, Weale P, Jerecic R, Li D. Three-dimensional T2-weighted MRI of the human femoral arterial vessel wall at 3.0 Tesla. Invest Radiol 2009;44(9):619-626.
21. Hennig J, Weigel M, Scheffler K. Multiecho sequences with variable refocusing flip angles: optimization of signal behavior using smooth transitions between pseudo steady states (TRAPS). Magn Reson Med 2003;49(3):527-535.
22. Jara H, Yu B C, Caruthers S D, Melhem E R, Yucel E K. Voxel sensitivity function description of flow-induced signal loss in MR imaging: implications for black-blood MR angiography with turbo spin-echo sequences. Magn Reson Med 1999;41(3):575-590.
23. Storey P, Atanasova I P, Lim R P, Xu J, Kim D, Chen Q, Lee VS. Tailoring the flow sensitivity of fast spin-echo sequences for noncontrast peripheral MR angiography. Magn Reson Med 2010;64(4):1098-1108.
24. Greenman RL, Wang X, Ngo L, Marquis R P, Farrar N. An assessment of the sharpness of carotid artery tissue boundaries with acquisition voxel size and field strength. Magn Reson Imaging 2008;26(2):246-253.
25. Cerrato P, Grasso M, Lentini A, Destefanis E, Bosco G, Caprioli M, Bradac G B, Bergui M. Atherosclerotic adult Moya-Moya disease in a patient with hyperhomocysteinaemia. Neurol Sci 2007;28(1):45-47.
26. Bland J M, Altman D G. Statistical methods for assessing agreement between two methods of clinical measurement. Lancet 1986;1(8476):307-310.
27. Rousson V, Gasser T, Seifert B. Assessing intrarater, interrater and test-retest reliability of continuous measurements. Stat Med 2002;21(22):3431-3446.
28. Fleiss J. Statistical methods for rates and proportions. 1981;2nd ed. New York, N.Y.: John Wiley & Sons, Inc: 218.
29. Bernstein M A, King K E, Zhou X J, Fong W. Handbook of MRI Pulse Sequences. 2004; 1st ed, Academic Press (equation 32, 36):609.
30. Lu H, Nagae-Poetscher L M, Golay X, Lin D, Pomper M, van Zijl PC. Routine clinical brain MRI sequences for use at 3.0 Tesla. J Magn Reson Imaging 2005;22(1):13-22.
31. Toussaint J F, Southern J F, Fuster V, Kantor H L. T2-weighted contrast for NMR characterization of human atherosclerosis. Arteriosclerosis, thrombosis, and vascular biology 1995;15(10):1533-1542.
32. McRobbie R W, Moore E A, Graves M J. MRI from picutre to proton. 2003; New York: Cambridge.
33. Wityk R J, Lehman D, Klag M, Coresh J, Ahn H, Litt B. Race and sex differences in the distribution of cerebral atherosclerosis. Stroke 1996;27(11):1974-1980.
34. Qureshi A I, Feldmann E, Gomez C R, Johnston S C, Kasner S E, Quick D C, Rasmussen PA, Suri M F, Taylor R A, Zaidat OO. Consensus conference on intracranial atherosclerotic disease: rationale, methodology, and results. J Neuroimaging 2009;19 Suppl 1:1S-10S.
35. Ashley W W, Jr., Zipfel G J, Moran C J, Zheng J, Derdeyn C P. Moyamoya phenomenon secondary to intracranial atherosclerotic disease: diagnosis by 3T magnetic resonance imaging. J Neuroimaging 2009;19(4):381-384.
36. Klein I F, Lavallee P C, Schouman-Claeys E, Amarenco P. High-resolution MRI identifies basilar artery plaques in paramedian pontine infarct. Neurology 2005;64(3):551-552.
37. Koktzoglou I, Chung Y C, Carroll T J, Simonetti O P, Morasch M D, Li D. Three-dimensional black-blood MR imaging of carotid arteries with segmented steady-state free precession: initial experience. Radiology 2007;243(1):220-228.
38. Balu N, Yarnykh V L, Chu B, Wang J, Hatsukami T, Yuan C. Carotid plaque assessment using fast 3D isotropic resolution black-blood MRI. Magn Reson Med 2010.
39. Zhang S, Cai J, Luo Y, Han C, Polissar NL, Hatsukami TS, Yuan C. Measurement of carotid wall volume and maximum area with contrast-enhanced 3D MR imaging: initial observations. Radiology 2003;228(1):200-205.
40. Thubrikar M J, Robicsek F. Pressure-induced arterial wall stress and atherosclerosis. Ann Thorac Surg 1995;59(6):1594-1603.

We claim:

1. A magnetic resonance imaging (MRI) system for intracranial vessel wall imaging, comprising:
a main magnet providing a substantially uniform main magnetic field $B_0$ for a subject under observation;
a radio frequency (RF) coil system configured to irradiate a plurality of radio frequency (RF) pulses into a region of interest of said subject and to detect a plurality of RF response signals emitted from said region of interest; and
a signal processing unit in communication with said RF coil system adapted to analyze said plurality of RF response signals,
wherein said RF coil system arranges said plurality of RF pulses in a pulse sequence, said pulse sequence including an excitation pulse and a plurality of refocusing pulses inducing a corresponding plurality of flip angles, a minimum flip angle of said plurality of flip angles being in the range of 30 degrees to 65 degrees, and a maximum flip angle of said plurality of flip angles being in the range of 100 degrees to 150 degrees, and
wherein said signal processing unit orders said plurality of RF response signals such that the highest amplitude RF signals are located in a center of k-space in order to enhance contrast between intracranial vessel wall tissue and at least one of cerebrospinal fluid or blood.

2. The MRI system of claim 1, wherein said pulse sequence has an echo time in the range of 25 milliseconds to 40 milliseconds.

3. The MRI system of claim 1, wherein said pulse sequence has an echo train length in the range of 50 pulses to 65 pulses.

4. The MRI system of claim 1, wherein a minimum flip angle of said plurality of flip angles is in the range of 45 degrees to 55 degrees, a maximum flip angle of said plurality of flip angles is in the range of 110 degrees to 130 degrees, and said pulse sequence has an echo time in the range of 35 milliseconds to 40 milliseconds and an echo train length in the range of 58 pulses to 62 pulses, and said signal processing unit analyzes said plurality of RF response signals with a three-dimensional isotropic resolution of 450 cubic microns or less.

5. The MRI system of claim 1, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and said signal processing unit analyzes said plurality of RF response signals with a three-dimensional isotropic resolution of 400 cubic microns or less.

6. The MRI system of claim 1, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and said signal processing unit analyzes said plurality of RF response signals with a three-dimensional isotropic resolution of 400 cubic microns or less.

7. A method for magnetic resonance imaging of intracranial vessel walls, comprising:
irradiating a plurality of RF pulses into a subject under observation,
recording a plurality of RF response signals from said subject under observation; and
analyzing the plurality of RF response signals,
wherein said plurality of RF pulses are arranged in a pulse sequence, said pulse sequence including an excitation pulse and a plurality of refocusing pulses inducing a corresponding plurality of flip angles, a minimum flip angle of said plurality of flip angles being in the range of 30 degrees to 65 degrees, and a maximum flip angle of said plurality of flip angles being in the range of 100 degrees to 150 degrees, and
wherein analyzing said RF response signals includes analyzing said plurality of RF response signals with an ordering said RF response signals such that the highest amplitude RF signals are located in a center of k-space in order to enhance contrast between intracranial vessel wall tissue and at least one of cerebrospinal fluid or blood.

8. The method of claim 7, wherein said pulse sequence has an echo time in the range of 25 milliseconds to 40 milliseconds.

9. The method of claim 7, wherein said pulse sequence has an echo train length in the range of 50 pulses to 65 pulses.

10. The method of claim 7, wherein a minimum flip angle of said plurality of flip angles is in the range of 45 degrees to 55 degrees, a maximum flip angle of said plurality of flip angles is in the range of 110 degrees to 130 degrees, and said pulse sequence has an echo time in the range of 35 milliseconds to 40 milliseconds and an echo train length in the range of 58 pulses to 62 pulses, and analyzing said RF response signals includes analyzing said plurality of RF response signals with a three-dimensional isotropic resolution of 450 cubic microns or less.

11. The method of claim 7, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and analyzing said RF response signals includes analyzing said plurality of RF response signals with a three-dimensional isotropic resolution of 400 cubic microns or less.

12. The method of claim 7, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and analyzing said RF response signals includes analyzing said plurality of RF response signals with a three-dimensional isotropic resolution of 400 cubic microns or less.

13. A non-transitory computer readable medium comprising a program that, when executed, causes a computer to:
irradiate a plurality of RF pulses into a subject under observation,
record a plurality of RF response signals from said subject under observation; and
analyze the plurality of RF response signals,
wherein said plurality of RF pulses are arranged in a pulse sequence, said pulse sequence including an excitation pulse and a plurality of refocusing pulses inducing a corresponding plurality of flip angles, a minimum flip angle of said plurality of flip angles being in the range of 30 degrees to 65 degrees, and a maximum flip angle of said plurality of flip angles being in the range of 100 degrees to 150 degrees, and
wherein analyzing said RF response signals includes analyzing said plurality of RF response signals with an ordering said RF response signals such that the highest amplitude RF signals are located in a center of k-space in order to enhance contrast between intracranial vessel wall tissue and at least one of cerebrospinal fluid or blood.

14. The non-transitory computer readable medium of claim 13, wherein said pulse sequence has an echo time in the range of 25 milliseconds to 40 milliseconds.

15. The non-transitory computer readable medium of claim 13, wherein said pulse sequence has an echo train length in the range of 50 pulses to 65 pulses.

16. The non-transitory computer readable medium of claim 13, wherein a minimum flip angle of said plurality of flip angles is in the range of 45 degrees to 55 degrees, a maximum flip angle of said plurality of flip angles is in the range of 110 degrees to 130 degrees, and said pulse sequence has an echo time in the range of 35 milliseconds to 40 milliseconds and an echo train length in the range of 58 pulses to 62 pulses, and analyzing said RF response signals includes analyzing said plurality of RF response signals with a three-dimensional isotropic resolution of 450 cubic microns or less.

17. The non-transitory computer readable medium of claim 13, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and analyzing said RF response signals includes analyzing said plurality of RF response signals with a three-dimensional isotropic resolution of 400 cubic microns or less.

18. The non-transitory computer readable medium of claim 13, wherein a minimum flip angle of said plurality of flip angles about 50 degrees, a maximum flip angle of said plurality of flip angles is about 120 degrees, said pulse sequence has an echo time of about 38 milliseconds and an echo train length of about 60 pulses, and analyzing said RF response signals includes analyzing said plurality of RF response signals with a three-dimensional isotropic resolution of 400 cubic microns or less.

\* \* \* \* \*

UNITED STATES PATENT AND TRADEMARK OFFICE
CERTIFICATE OF CORRECTION

PATENT NO. : 9,625,548 B2
APPLICATION NO. : 13/922111
DATED : April 18, 2017
INVENTOR(S) : Bruce A. Wasserman et al.

Page 1 of 1

It is certified that error appears in the above-identified patent and that said Letters Patent is hereby corrected as shown below:

In the Applicant item (71), replace "JOHNS HOPKINS UNIVERSITY, Baltimore, MD (US)" with
-- THE JOHNS HOPKINS UNIVERSITY, Baltimore, MD (US)" --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*